(12) United States Patent
Roessiger

(10) Patent No.: US 7,177,788 B2
(45) Date of Patent: Feb. 13, 2007

(54) METHOD FOR DETERMINING STATISTICAL FLUCTUATIONS OF VALUES OF GEOMETRICAL PROPERTIES OF STRUCTURES REQUIRED FOR THE FABRICATION OF SEMICONDUCTOR COMPONENTS

(75) Inventor: Martin Roessiger, Dresden (DE)

(73) Assignee: Infineon Technologies AG, Munich (DE)

( * ) Notice: Subject to any disclaimer, the term of this patent is extended or adjusted under 35 U.S.C. 154(b) by 729 days.

(21) Appl. No.: 10/272,848

(22) Filed: Oct. 17, 2002

(65) Prior Publication Data

US 2003/0074168 A1    Apr. 17, 2003

(30) Foreign Application Priority Data

Oct. 17, 2001    (DE)    ................................. 101 51 207

(51) Int. Cl.
*G06F 17/50*    (2006.01)
(52) U.S. Cl. ................................. 703/13; 703/14; 716/4
(58) Field of Classification Search .................... 716/4, 716/160; 713/160; 700/121; 703/13, 14; 707/101
See application file for complete search history.

(56) References Cited

U.S. PATENT DOCUMENTS 5,646,870 A    7/1997    Krivokapic et al.
5,781,430 A *  7/1998    Tsai ............................ 700/28
6,381,564 B1 * 4/2002    Davis et al. .................. 703/22

OTHER PUBLICATIONS

Boning et. al., , May 1994, IEEE Transactions on Semiconductor Manufacturing, vol. 7, Issue 2, pp. 233-244 "DOE/Opt: A system for design of experiments, response surface modeling, and optimization using process and device simulation".*
IEEE 100 The Authoritative Dictionary of IEEE standards terms, seventh edition, 2000.*
Charrier, E. W. et al.: "Yield Modeling and Enhancement for Optical Lithography", SPIE, vol. 2440, pp. 435-447.

* cited by examiner

*Primary Examiner*—Paul Rodriguez
*Assistant Examiner*—Eun Hee Chung
(74) *Attorney, Agent, or Firm*—Laurence A. Greenberg; Werner H. Stemer; Ralph E. Locher

(57) ABSTRACT

Input parameters and technically possible parameter values associated therewith are selected, from which are obtained support point values and result values assigned thereto for the geometrical properties. At each support point value, the respective result value is assigned to the parameter value assigned to the respective support point value. A response surface is adapted to the result values in a total range of the assigned parameter values. This results in response values for which a minimum value and a maximum value are determined in subranges. A total interval is formed from the largest response value overall and the smallest response value overall. The total interval is divided into a given number of sub-intervals. For each of the sub-intervals, the individual probabilities are cumulated, which yields a total probability value for a respective sub-interval over all the value intervals.

4 Claims, 4 Drawing Sheets

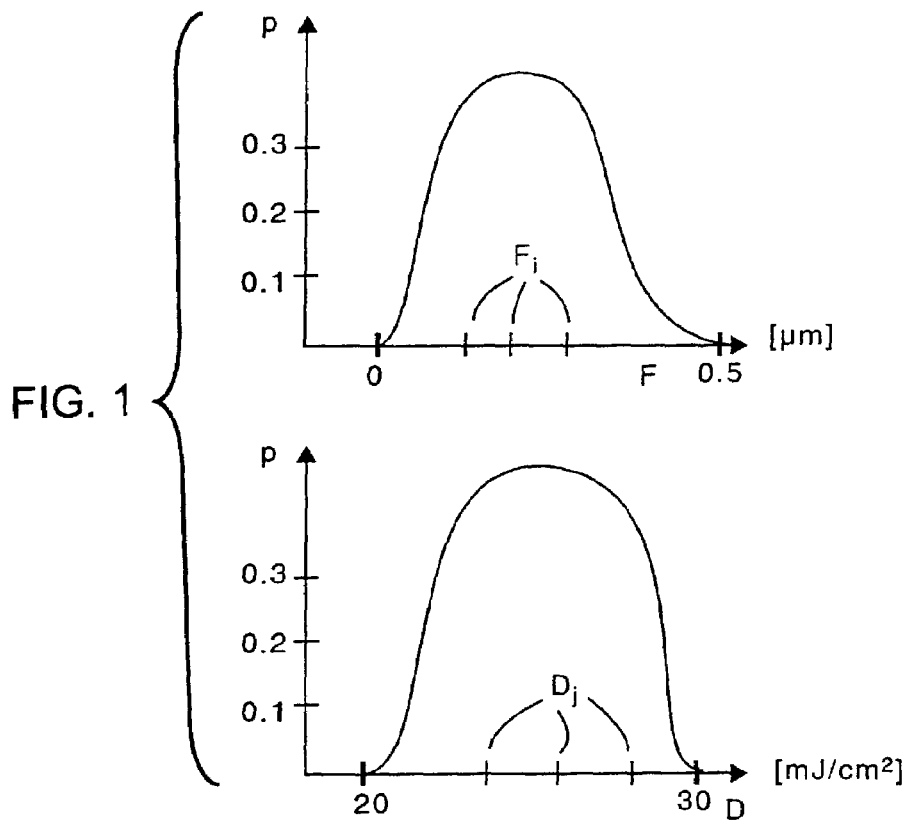
FIG. 1
FIG. 2
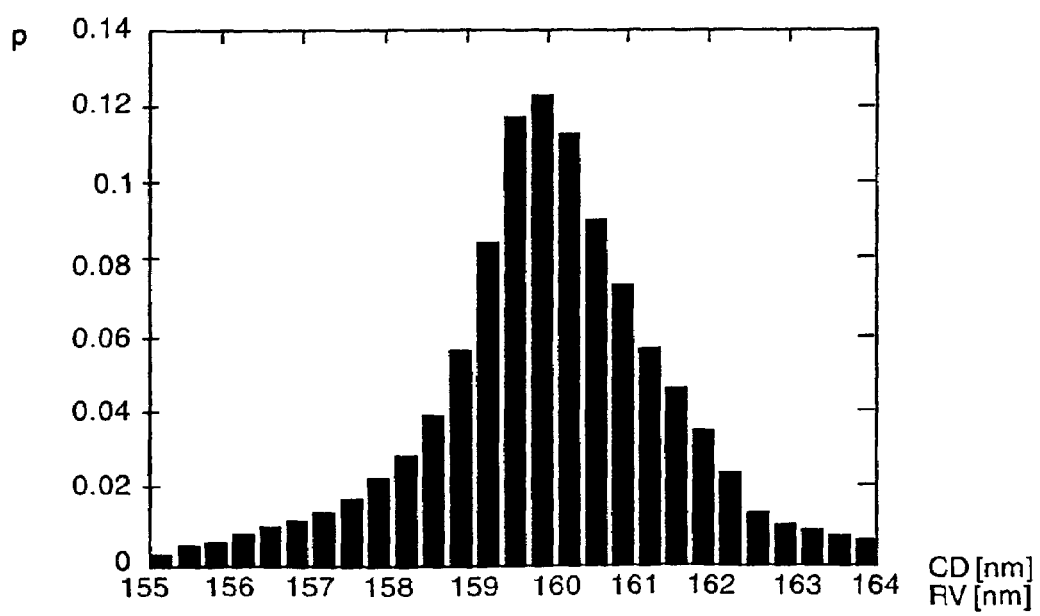

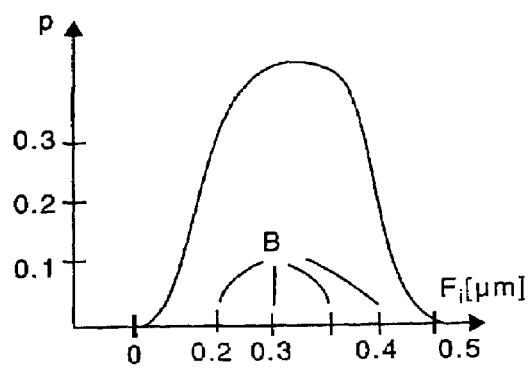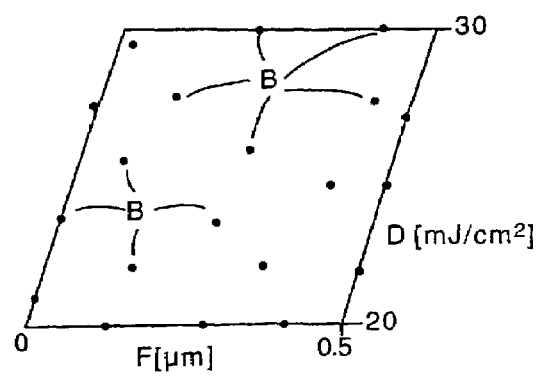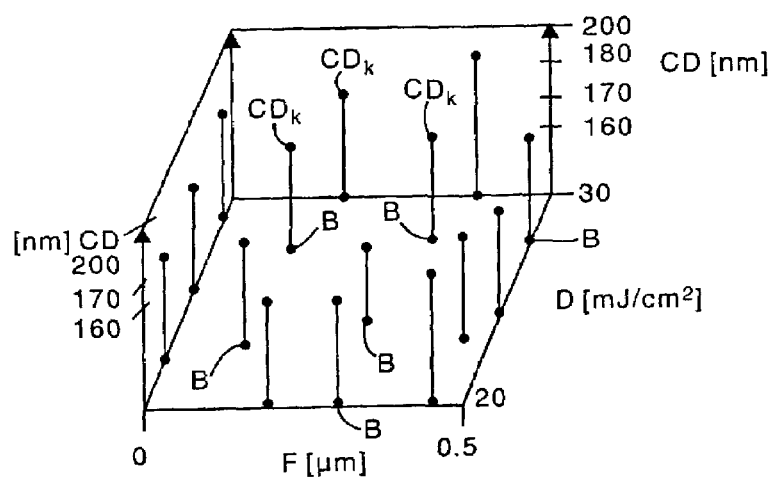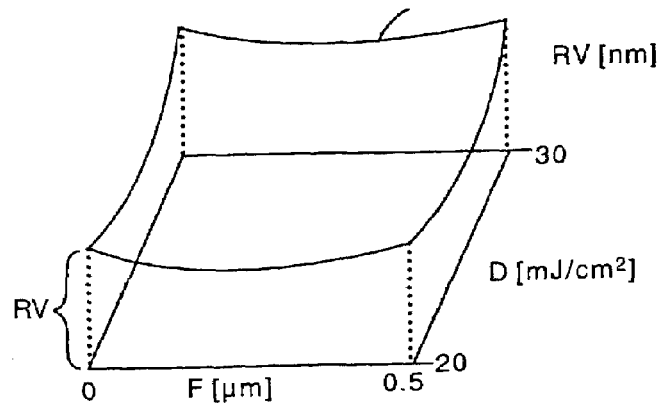

METHOD FOR DETERMINING STATISTICAL FLUCTUATIONS OF VALUES OF GEOMETRICAL PROPERTIES OF STRUCTURES REQUIRED FOR THE FABRICATION OF SEMICONDUCTOR COMPONENTS

BACKGROUND OF THE INVENTION

FIELD OF THE INVENTION

The present invention lies in the semiconductor manufacturing field. More specifically, the invention relates to a method for determining statistical fluctuations in the values of geometrical properties of structures required for the fabrication of semiconductor components, the fluctuations being based on statistical fluctuations of values of input parameters.

Integrated semiconductor components have a multiplicity of structures such as metallic interconnects and semiconducting structures produced by etching. During the fabrication of a multiplicity of inherently mutually identical semiconductor components, as is quite generally known, the geometrical dimensions of mutually comparable structures of these semiconductor components fluctuate from semiconductor component to semiconductor component. This is due, as is likewise quite generally known, inter alia essentially to corresponding fluctuations in the dimensions or the geometrical properties of the photoresist structures used to fabricate the structures. In this case, the individual dimension values or the geometrical properties of the structures, considered over a multiplicity of semiconductor components to be fabricated, occur in each case with a probability that is intrinsic to the respective value. These geometrical properties are determined by a multiplicity of parameters, such as e.g. by the focus used during exposure of photoresist (focus=distance between focal point of a lens or a lens system and photoresist), by the dose used during exposure, by the size of the structures situated on a mask, by the degree of light transmission of partly light-opaque regions of the mask (a typical value for this is 6%±0.5%), of the optical properties of the resist used. The values of these parameters, likewise again considered over the multiplicity of semiconductor components to be fabricated, likewise again occur with a statistically distributed probability.

It is of particular interest, then, both for the developer and for the manufacturer of the semiconductor components to know or to be able to determine and predict the statistical fluctuation and distribution of the values of these geometrical properties.

For this reason, various methods have been developed in the past, one of which is presented in the journal "SPIE", see Vol. 2440, pages 435–47. These methods make it possible, even before series or mass production has started, to be able to determine whether a specific planned product (=semiconductor component) which, by its nature, is intended to have structures of specific geometry, will be able to be produced by means of a specific apparatus provided for the production. In this case it is also possible to determine what values or what range of values those parameters are to have whose values are determined by the equipment, or by the properties of chemical substances used, such as e.g. photoresist.

A disadvantage of the prior art methods is that they are very computation-time-intensive and thus require a long and expensive time before a desired result is present.

SUMMARY OF THE INVENTION

It is accordingly an object of the invention to provide a method by which statistical fluctuations (=distributions) of values of geometrical properties of structures can be determined and predicted, which overcomes the above-mentioned disadvantages of the heretofore-known devices and methods of this general type and which method is less time-consuming and thus also less expensive than the prior art methods.

With the foregoing and other objects in view there is provided, in accordance with the invention, a method for determining statistical fluctuations of values of geometrical properties of structures required in a fabrication of semiconductor components, the fluctuations being based on statistical fluctuations of values of input parameters. The method comprises the following steps:

a) selecting at least one input parameter and technically possible parameter values associated therewith;

b) for each input parameter, acquiring a probability of an occurrence of each individual one of the technically possible parameter values;

c1) if more than one input parameter had been selected in step a), selecting, with design of experiments methods, from a total set of the technically possible parameter values of the selected input parameters combinations of parameter values of the different selected input parameters, serving as support point values in the further course of the method;

c2) otherwise selecting a given number from the technically possible values acquired, which serve as support point values in the further course of the method;

d) determining a result value of a geometrical property for each support point value, and assigning the result value to the support point value;

e) at each support point value, assigning a respective result value of the geometrical property to the parameter value, assigned to the respective support point value, of the selected input parameters;

f) adapting a response surface to the result values in the entire range of the assigned parameter values of the input parameters, to thereby form response values;

g) combining for each input parameter a number of mutually neighboring parameter values to form a parameter set;

h) repeating step g) until all the parameter values of each input parameter are acquired by corresponding parameter sets;

i1) if more than one input parameter had been selected in step a), combining parameter sets of in each case mutually different parameters to form units;

i2) if only one input parameter had been selected in step a), allowing the respective parameter sets to form respective units;

j) from the probability of the occurrence of the individual parameter values of the input parameters, determining for each of the units a probability value associated with the respective unit;

k) relating the response surface to the units and dividing the response surface into subranges according to the units;

l) determining a minimum value and a maximum value of the response values of the response surface in each subrange;

m) for each subrange, forming a respective value interval defined by the respective minimum value and the respective maximum value of the response values;

n) determining a largest response value overall and a smallest response value overall over the entire response surface;

o) forming a total interval from the largest response value overall and the smallest response value overall;

p) dividing the total interval into a given number of sub-intervals, with each of the value intervals comprising a number of sub-intervals;

q) within the total interval, for each subrange and thus for each value interval, determining a probability for an occurrence of the response values in each of the sub-intervals such that each sub-interval of the total interval lying outside the value interval associated with the respective subrange considered is assigned a probability value 0, and that each remaining sub-interval of the total interval is assigned a probability value resulting from a probability value assigned to a unit assigned to the respective sub-range and the number of sub-intervals forming the respective value interval; and r) for each of the sub-intervals, cumulating individual probabilities determined for each value interval according to step q), to yield a total probability value for a respective sub-interval over all the value intervals.

In accordance with an added feature of the invention, the result values for the support point values are determined by a simulation (in step d)).

In accordance with an alternative feature of the invention, the result values for the support point values are determined experimentally.

In accordance with a concomitant feature of the invention, during a determination of the probability for the occurrence of a response value, the distance between the respective response value and the boundary of the respective value interval is concomitantly taken into account by weighting (in step q)).

Other features which are considered as characteristic for the invention are set forth in the appended claims.

Although the invention is illustrated and described herein as embodied in a method for determining statistical fluctuations of values of geometrical properties of structures required for the fabrication of semiconductor components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 illustrates two graphs showing a probability distribution for values of two different input parameters;

FIG. 2 is a graph showing a probability distribution of values of a geometrical property as a result of the method according to the invention;

FIGS. 3A, 3B, and 4–8 are various graphs showing probability distributions in the context of different method steps in the order in which they are executed.

DESCRIPTION OF THE PREFERRED EMBODIMENTS

Figure 6:
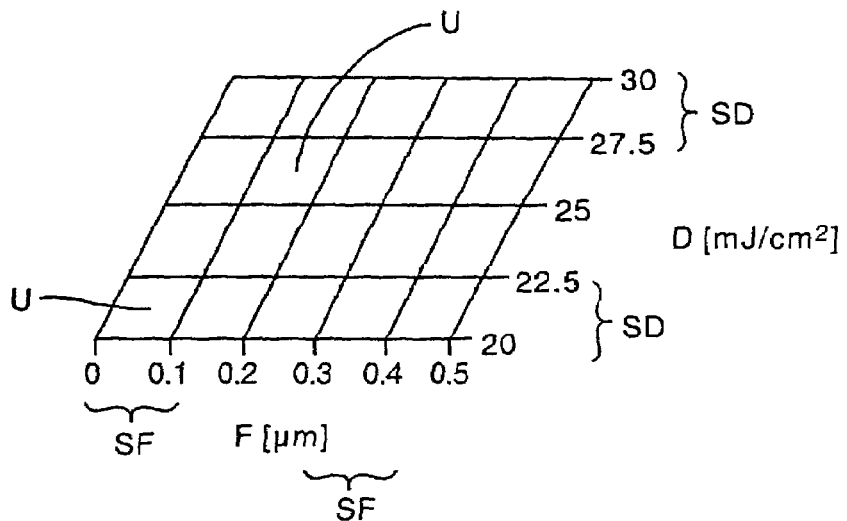

When executing the method according to the invention, two different input parameters F and D are selected in the present exemplary embodiment (the method could also be executed with just a single input parameter or else with more than two input parameters). One input parameter F chosen here is the focus, for example, i.e. the distance between the focal point of a lens or a lens system and a photoresist during exposure thereof. The other input parameter D chosen here is the exposure dose. By way of example, from the technical data of that apparatus which is to be used to carry out a desired exposure of photoresist, those parameter values of the input parameters which are technically possible with the apparatus are known. Furthermore, the probabilities with which these technically possible parameter values occur in practice are also known.

Referring now to the figures of the drawing in detail and first, particularly, to FIG. 1 thereof, there is shown, in the upper illustration, on the horizontal axis, technically possible values of one input parameter F (=focus) and, in depicted fashion, the density function of the associated probability distribution, represented with values on the vertical axis. In the lower illustration of FIG. 1, the same is shown correspondingly with regard to the other parameter D (=dose). The values $F_i$ and $D_j$ designate individual values of the respective parameters F, D. In the case of the horizontal axes the dimension of the respective input parameter is specified, in each case in square brackets.

FIG. 2 shows, in the form of a bar graph, the result of the method according to the invention, namely what values (=: "geometrical property") the structure will assume with what statistical probability in the case of occurrence of the chosen input parameters in accordance with the values according to FIG. 1.

After the parameters F, D have been chosen, the technically possible parameter values $F_i$, $D_j$ associated with them are acquired, as are the probabilities of the occurrence of the latter. Afterward, generally known "design of experiments" methods are used to select from the total set of the technically possible parameter values $F_i$, $D_j$ of the selected input parameters F, D combinations of parameter values $F_i$, $D_j$ of the different selected input parameters F, D, which serve as support point values (B) in the further course of the method. The term "design of experiments" methods is usually abbreviated to "DoE" by experts; more detailed information on these methods that are generally customary in the field of statistical experimental design can be gathered from the following books:

Retzlaff G., Rust G., Waibel J.: Statistische Versuchsplanung [Statistical experimental design], 2nd edition, published by Chemie Weinheim, 1978;

Scheffler E., Statistische Versuchsplanung und -Auswertung. Eine Einführung für Praktiker [Statistical experimental design and evaluation. An introduction for practitioners]. 3rd newly revised and extended edition, Deutscher Verlag für Grundstoffindustrie, Stuttgart 1997.

Support point values B are illustrated in the right-hand illustration of FIG. 3: once again said one input parameter F (=focus) with its parameter values $F_i$ is plotted on the horizontal axis and the other input parameter D (=dose) with its parameter values $D_i$ is plotted on a further axis. Combinations of parameter values $F_i$ and $D_i$ are illustrated as the support point values B. The two axes span a so-called parameter space. This parameter space is two-dimensional in the present exemplary embodiment.

However, it may also encompass more than two dimensions (in a case where more than two input parameters have been selected) or, alternatively, just a single dimension: the case of a one-dimensional parameter space is illustrated in the left-hand illustration of FIG. 3: the upper illustration of FIG. 1 is illustrated there, namely said one parameter F (=focus) with the density function of the probability distribution of the occurrence of the individual technically possible parameter values $F_i$. In this case, the parameter space is formed by the technically possible parameter values $F_i$ on the horizontal axis. In the case where only a single parameter (here: F focus) had been selected, and which is illustrated in the left-hand illustration of FIG. 3, individual values of the technically possible parameter values $F_i$ are selected, once again according to the abovementioned "design of experiments" methods. These selected values can then serve, in accordance with those with regard to the two-dimensional parameter space, as support point values B in the further method.

The support point values B thus represent selected values of the input parameter chosen (in the case where only a single input parameter has been selected) or selected combinations of values of the input parameters (in the case where at least two different input parameters have been chosen).

After the selection (and thus: definition) of the support point values B, a result value $CD_k$ is determined for each of these support point values B, the geometrical property CD having said result value in the case of this respective support point value B. This can be done either experimentally or by simulation, in other words in the case of the respective combination of input parameter values $F_i$, $D_j$ of the input parameters F, D (corresponding simulators are generally known). It is assumed in the present exemplary embodiment that the geometrical property CD (to be determined) is the parameter "critical dimension" that is quite generally known by experts. "Critical dimension" is generally understood by experts as the minimum required dimension of a structure in order to be able to be fabricated taking account of the other technical conditions (here: input parameters).

Thus, in an experimental determination of the result values $CD_k$ of the property CD, structures are fabricated using the support point values B, which were selected as described above. As likewise already specified above, the support point values B represent selected combinations of parameter values $F_i$, $D_j$ of the selected input parameters F, D. In the case where the property CD is the parameter "critical dimension" (which is actually assumed in the present exemplary embodiment), the individual result values $CD_k$ of the property CD represent resulting widths of the resist or of structures on a semiconductor wafer or else, depending on the definition of "critical dimension", resulting distances between resist strips or structures.

In the further method, as illustrated in FIG. 4, the result values $CD_k$ of the geometrical property CD are then assigned to the input parameter values $F_i$ and $D_j$ assigned to the support point values B via the respective support point values B assigned to the result values $CD_k$. Consequently, there is an unambiguous relationship between the result values $CD_k$ of the geometrical property CD, on the one hand, and the input parameter values $F_i$, $D_j$ of the input parameters F, D, on the other hand.

As illustrated in a simplified manner in FIG. 5, a so-called "response surface" RS that is generally known in the context of the "design of experiments" methods is then adapted to these result values $CD_k$ in the total range of the assigned input parameter values $F_i$, $D_j$ of the input parameters F, D. The term "response surface" is also explained in greater detail in the books already specified above. FIG. 5 reveals that this "response surface" RS spans the parameter space spanned by the chosen input parameters F, D with their technically possible parameter values $F_i$, $D_j$ at distances which result from the result values $CD_k$ through the adaptation of the "response surface" RS (for reasons of clarity, neither these distances nor the respectively associated combinations of technically possible parameter values $F_i$, $D_j$ are depicted). These distances are then regarded as response values RV in the further course of the method. These response values RV represent, in the total parameter space spanned, an approximation of all the result values occurring in the parameter space.

Then, illustrated in FIG. 6, in the case of the input parameter space given by the chosen input parameters F, D, for each input parameter F or D, a freely selectable number of mutually neighboring parameter values $F_i$, $D_j$ are combined to form a respective parameter set SF or SD, respectively. This is repeated for each input parameter F or D until, for each input parameter F or D, all the parameter values $F_i$, $D_j$ are acquired by a respective parameter set SF or SD.

In the present exemplary embodiment, two input parameters F, D were selected at the beginning of the method according to the invention. In this case and in all cases where at least two input parameters had been selected at the beginning of the method according to the invention, the parameter sets SF, SD of the different parameters F, D are then combined to form respective units U. This is done until each of said one parameter sets SF is combined with each of the other parameter sets SD to form a respective unit U, and vice versa. This is also illustrated in FIG. 6: the units U result as four-cornered areas in the case where originally two input parameters had been selected. Parallelepipeds would result in a (non-illustrated) case where three input parameters had been assumed to have been selected. And in the case where only a single input parameter had been selected (likewise not illustrated), sections of a line would result, specifically because each of the parameter sets of the one originally selected input parameter would simultaneously be one of the units U as well.

Figure 7:
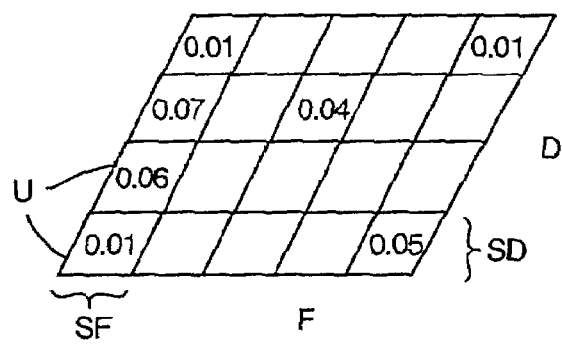

Afterward, for each of the units U, a probability value p associated with the respective unit U is determined (in accordance with FIG. 7) from the probability of occurrence of the individual parameter values $F_i$, $D_j$ (cf. FIG. 1 and associated description) of the chosen input parameters F, D. This is done, as is generally customary in probability calculation, by multiplying the individual probability values together. In FIG. 7, the probability value thus determined is entered for some of the units (e.g. "0.01"), the entered values as such only being by way of example.

The "response surface" RS (see FIG. 5) is then linked with the parameter space already mentioned insofar as each of the units U of the parameter space (see FIGS. 6, 7) is assigned a subrange URS of the "response surface" RS in such a way that the parameter values $F_i$, $D_j$—associated with a respective subrange URS—of the chosen input parameters F, D are the same parameters $F_i$, $D_j$ as in the case of the respective unit U. For reasons of clarity, this is illustrated in FIG. 8 in a manner reduced to a single subrange URS and a single unit U.

Figure 8:
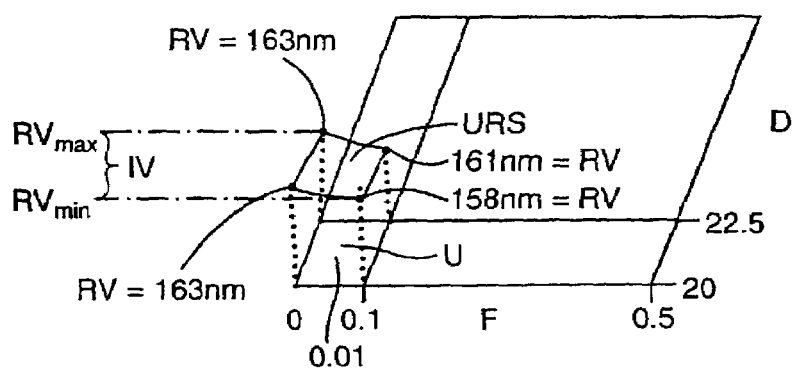

In actual fact, FIG. 8 should show the entire "response surface" RS, as illustrated in FIG. 5, but divided into subranges URS, of which, however, only a single subrange URS is shown in FIG. 8. FIG. 8 also specifically depicts that unit U with its probability value of 0.01 (in this respect, also cf. FIG. 7) which is assigned the subrange URS illustrated.

Figure 9:
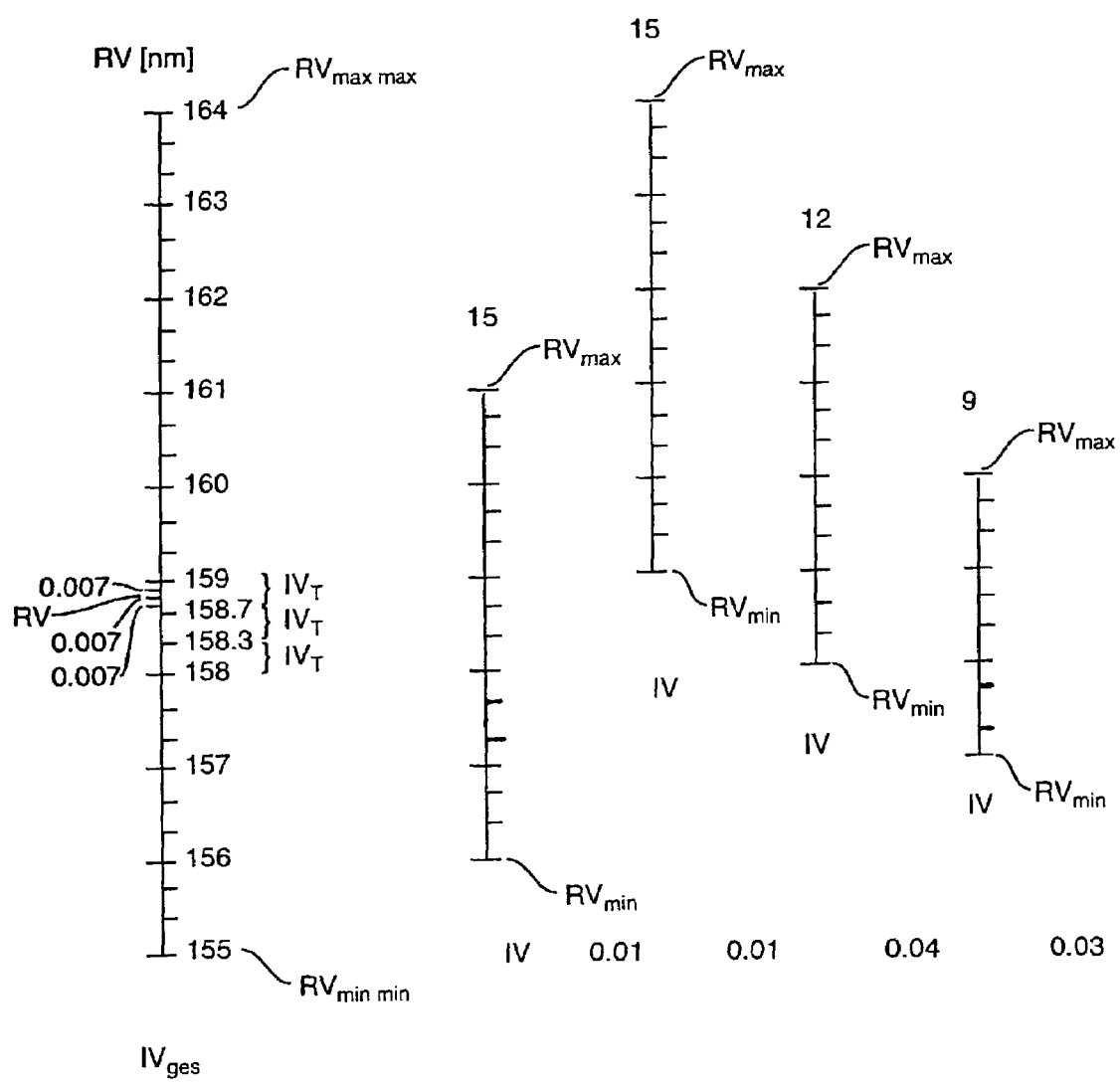
FIG. 9 is a display of several exemplary values for determining the result of the method.

After the division of the "response surface" RS into subranges URS and the assignment of the subranges URS to the units U, a minimum value $RV_{min}$ and a maximum value $RV_{max}$ of the response values RV of the "response surface" RS are determined in each of the subranges URS. For each subrange URS, a respective value interval IV is then formed from its respective minimum value $RV_{min}$ and from its respective maximum value $RV_{max}$ (see FIGS. 8 and 9). Furthermore, the largest response value $RV_{maxmax}$ overall and the smallest response value $RV_{minmin}$ overall are determined with regard to all the subranges URS. A total interval $IV_{tot}$ is formed from the largest response value $RV_{maxmax}$ overall and the smallest response value $RV_{minmin}$ overall. Said total interval is illustrated in FIG. 9 (see far left therein).

The total interval $IV_{tot}$ is divided into a given number (e.g. 27 in FIGS. 2 and 9) of sub-intervals $IV_T$. In this case, each of the value intervals IV comprises a number of sub-intervals $IV_T$. This number can differ from value interval IV to value interval IV, as can be seen from FIG. 9, which is yet to be explained: FIG. 9 shows (inter alia) four value intervals IV which are picked out arbitrarily from the total number of value intervals IV and comprise 15, 15, 12 and 9 sub-intervals $IV_T$.

Afterward, likewise within said total interval $IV_{tot}$, for each of the subranges URS (and thus for each of the value intervals IV), that probability is determined with which the result values RV occur in each of the sub-intervals $IV_T$ of the total interval $IV_{tot}$ within a respective one of the subranges URS or the respective value interval IV. This is done in such a way that each sub-interval $IV_T$ from the total interval $IV_{tot}$ which lies outside the value interval IV associated with a respective subrange URS considered is assigned the probability value 0, and that each of the remaining sub-intervals $IV_T$ from the total interval $IV_{tot}$ of the value interval IV associated with the respective subrange URS considered is assigned a probability value which results from the probability value which is assigned to a unit U assigned to the respective subrange URS (e.g. 0.01 for the unit U explicitly illustrated in FIG. 8) and the number of sub-intervals $IV_T$ which the respective value interval IV comprises.

This is explained in more detail below using a concrete example with the aid of FIG. 9: concrete consideration is given here extractwise to a subrange of RV=158 nm to 159 nm of a total interval $IV_{tot}$ of RV=155 nm to RV=164 nm with sub-intervals $IV_T$ of 158 nm to 158.3 nm, of 158.3 nm to 158.7 nm and of 158.7 nm to 159 nm. The left-hand column shows the total interval $IV_{tot}$ of the response values RV from $RV_{minmin}$=155 nm to $RV_{maxmax}$=164 nm. This is followed toward the right by the illustrations of four mutually different intervals IV (and thus also of four mutually different subranges URS assigned thereto) with their respective smallest response values $RV_{min}$=156 nm, 159 nm, 158 nm and 157 nm and with their respective largest response values $RV_{max}$=161 nm, 164 nm, 162 nm and 160 nm.

The subrange of RV=158 nm to RV=159 nm is now picked out by way of example, as already specified above. As likewise already specified, this subrange has three sub-intervals $IV_T$. Three of the four value intervals IV shown in FIG. 9 have, in this subrange, response values RV in the abovementioned subintervals $IV_T$. These are the first, third and fourth value intervals IV (counted from the left). The second value interval IV has no response values RV here. In the case of the first value interval IV, the response values RV occur with a probability of 0.01 (in this respect, also cf. FIGS. 7 and 8); likewise in the case of the second value interval IV. In the case of the third value interval IV, the response values RV occur with a probability of 0.04; correspondingly with 0.03 in the case of the fourth value interval IV. These probability values are entered below the respective value interval IV in FIG. 9. The value intervals IV considered here comprise 15, 15, 12 and 9 sub-intervals $IV_T$, as entered above the illustration of the respective value intervals IV in FIG. 9. The probability for the occurrence of response values RV in a sub-interval $IV_T$ of a value interval IV is then calculated as "probability value of the response values RV" divided by the "number of sub-intervals $IV_T$ of the value interval IV considered".

Finally, for each individual sub-interval $IV_T$, the individual probabilities determined according to the preceding step are then cumulated over all the value intervals IV. The total probability for the occurrence of response values RV in the sub-interval $IV_T$ of RV=158 nm to RV=158.3 nm over all the value intervals IV considered (in the present example: four), is then calculated as follows (depicted in the left-hand column, which shows the total interval $IV_{tot}$):

$$0.01/15 + 0 + 0.04/14 + 0.03/9 = 0.007.$$

Response values RV in the sub-interval $IV_T$ of 158.3 nm to 158.7 nm (likewise) occur with the probabilities of 0.01, 0.04 and 0.03 in the case of three value intervals IV, which results in a total probability of (likewise) 0.007. The same results for the third sub-interval $IV_T$ of RV=158.7 nm to RV=159 nm (the fact that these values for the total probabilities are all identical here is purely by chance and is based merely on the fact that, by chance, none of the value intervals IV shown (by way of example) begins or ends in the chosen subrange from RV=158 nm to RV=159 nm).

The result can then be represented graphically e.g. in the form of a bar chart: see FIG. 2.

FIG. 2 shows, for the total interval from RV=155 nm to RV=164 nm, the statistical distribution p for the occurrence of response values RV in the individual sub-intervals $IV_T$: in the range from RV=155 nm to RV<155.3 nm, said distribution is, for example, 0.0028 corresponding to 0.28%. In the ranges from RV=155.3 nm to RV<155.7 nm and from RV=155.7 nm to RV=156 nm, said distribution is in each case approximately 0.005 corresponding to 0.5%. Since the illustration in FIG. 2 is based on more value intervals IV (e.g. 400) than is assumed in the present example, different probability values result for the individual sub-intervals $IV_T$.

In a development of the present invention, it is also advantageous if, during the determination of the probability for the occurrence of a response value RV in a value interval IV, the distance between the respective response value RV and the boundary of the relevant value interval IV is concomitantly taken into account by weighting. This can be done in such a way that, in a case where such a response value RV lies in the middle of a value interval IV, the response value RV is taken into account to a greater extent than those response values RV which are situated in the region between the middle and a respective edge of the value interval IV. In this case, this weighting can decrease toward the respective edge. It must be taken into consideration, however, that the sum of all the probabilities assigned to the sub-intervals $IV_T$ in this way corresponds precisely to the probability of the occurrence of a response value RV in the value interval IV considered (e.g. to the value 0.01 in the case of the value interval IV illustrated on the far left in FIG. 9).

Thus, by means of the method according to the invention, it is possible, taking as a basis technical conditions with statistically governed fluctuations in their values (in the nomenclature of the present invention: technical input parameters with statistically fluctuating values, i.e. with values whose occurrence follows a frequency distribution), to process them in such a way that, as a result, it is possible to determine a further technical condition, i.e. a technical property, including statistical distribution of its (technical) values.

By way of example, in the case of an exposure installation for fabricating semiconductor components, from its inherent properties and operating modes such as e.g. focus (=distance between the focal point of a lens or a lens systems and photoresist), exposure dose, resist properties, mask properties, etc., together with the values of these properties and the statistical variation thereof which are either known or else assumed, it is possible to infer a technical result such as e.g. the line width of developed photoresist or the width of interconnects or other structures of components to be fabricated, with their values and the statistical distribution (=frequency) with which these values are established. As a result, it is then possible to examine, for example, whether specific, desired semiconductor components which are intended to have specific technical properties, such as the line width already mentioned, can be fabricated with existing apparatuses which, after all, have specific properties (in the sense of input parameters). However, it is also possible to examine, in any event for example, what technical properties (in the sense of input parameters or, alternatively, as a result) including the statistical variations of their values new machines to be procured must have in order that a (newly developed) future semiconductor component will actually be able to be technically fabricated in the first place. Expected yield FIGS. can also be predicted in this way.

Experiments have revealed that the method according to the invention requires significantly less time to carry out and is thus also significantly less expensive to carry out than methods known heretofore.

I claim:

1. A method for determining statistical fluctuations of values of geometrical properties of structures required in a fabrication of semiconductor components, the fluctuations being based on statistical fluctuations of values of input parameters, the method which comprises the following steps:
   a) selecting at least one input parameter and technically possible parameter values associated therewith;
   b) for each input parameter, acquiring a probability of an occurrence of each individual one of the technically possible parameter values;
   c1) if more than one input parameter had been selected in step a), selecting, with design off experiments methods, from a total set of the technically possible parameter values of the selected input parameters, combinations of parameter values of the different selected input parameters, serving as support point values in the further course of the method;
   c2) otherwise selecting a given number of parameter values from the technically possible parameter values, which serve as support point values in the further course of the method;
   d) determining a result value of a geometrical property for each support point value, and assigning the result value to the support point value;
   e) at each support point value, assigning a respective result value of the geometrical property to the parameter values, assigned to the respective support point value, of the selected input parameters;
   f) adapting a response surface, which results from applying design of experiments methods, to the result values in the entire range of the assigned parameter values of the input parameters, to thereby form response values;
   g) combining for each input parameter a number of mutually neighboring parameter valueB to form a parameter set;
   h) repeating step g) until all the parameter values of each input parameter are acquired by corresponding parameter sets;
   i1) if more than one input parameter had been selected in step a), combining all parameter sets of in each case mutually different parameters to form units;
   i2) if only one input parameter had been selected in step a), allowing the respective parameter sets to form respective units;
   j) from the probability of the occurrence of the individual parameter values of the input parameters, determining for each of the units a probability value associated with the respective unit;
   k) relating the response surface to the units and dividing the response surface into subranges according to the units;
   l) determining a minimum value and a maximum value of the response values of the response surface in each subrange;
   m). for each subrange, forming a respective value interval defined by the respective minimum value and the respective maximum value of the response values;
   n) determining a largest response value overall and a smallest response value overall over the entire response surface;
   o) forming a total interval from the largest response value overall and the smallest response value overall;
   p) dividing the total interval into a given number of sub-intervals, with each of the value intervals comprising a number of sub-intervals;
   q) within the total interval, for each subrange and thus for each value interval, determining a probability for an occurrence of the response values in each of the sub-intervals such that each sub-interval of the total interval lying outside the value interval associated with the respective subrange considered is assigned a probability value 0, and that each remaining sub-interval of the total interval is assigned a probability value resulting from a probability value assigned to a unit assigned to the respective subrange and the number of sub-intervals forming the respective value interval;
   r) for each of the sub-intervals, cumulating individual probabilities deteiTmined for each value interval according to step q). to yield a total probability value for a respective sub-interval over all the value intervals.

2. The method according to claim 1, wherein step d) comprises determining the result values for the support point values by simulation.

3. The method according to claim 1, wherein step d) comprises determining the result values for the support point values experimentally.

4. The method according to claim 1, wherein in step q), during a determination of the probability for the occurrence of a response value, the distance between the respective response value and a boundary of the respective value interval is concomitantly taken into account by weighting.

* * * * *